United States Patent
Miyakoshi et al.

(10) Patent No.: US 9,538,648 B2
(45) Date of Patent: *Jan. 3, 2017

(54) LIQUID COMPOSITION AND METAL-BASED CIRCUIT BOARD

(75) Inventors: Ryo Miyakoshi, Tsukuba (JP); Takeshi Kondo, Tsukuba (JP); Nobuaki Koyama, Yokohama (JP); Kazuhiko Konomi, Yokohama (JP)

(73) Assignees: SUMITOMO CHEMICAL COMPANY, LIMITED, Tokyo (JP); NHK SPRING CO., LTD, Kanagawa (JP)

( * ) Notice: Subject to any disclaimer, the term of this patent is extended or adjusted under 35 U.S.C. 154(b) by 48 days.

This patent is subject to a terminal disclaimer.

(21) Appl. No.: 13/636,399

(22) PCT Filed: Mar. 18, 2011

(86) PCT No.: PCT/JP2011/056645
§ 371 (c)(1),
(2), (4) Date: Oct. 12, 2012

(87) PCT Pub. No.: WO2011/118539
PCT Pub. Date: Sep. 29, 2011

(65) Prior Publication Data
US 2013/0037313 A1    Feb. 14, 2013

(30) Foreign Application Priority Data
Mar. 24, 2010    (JP) ................. 2010-068780

(51) Int. Cl.
*H05K 1/05*    (2006.01)

(52) U.S. Cl.
CPC ....... *H05K 1/056* (2013.01); *H05K 2201/0141* (2013.01); *H05K 2203/0759* (2013.01)

(58) Field of Classification Search
None
See application file for complete search history.

(56) References Cited

U.S. PATENT DOCUMENTS 6,570,099 B1 * 5/2003 Hirano ............... H01L 23/36
174/258
2002/0055607 A1    5/2002 Okamoto et al.
2002/0143135 A1    10/2002 Okamoto et al.
(Continued)

FOREIGN PATENT DOCUMENTS

CN    1 01 5351 76 A    9/2009
JP    58-15290 A    1/1983
(Continued)

OTHER PUBLICATIONS

English Translation of JP02240138.*
(Continued)

*Primary Examiner* — Cynthia H Kelly
*Assistant Examiner* — Anna Malloy
(74) *Attorney, Agent, or Firm* — Sughrue Mion, PLLC

(57) ABSTRACT

A liquid composition containing a liquid crystalline polyester, a solvent, and a boron nitride having a volume average particle diameter of not less than 10 μm and not more than 80 μm, wherein the amount of the boron nitride is 30 to 90% by volume based on the total amount of the liquid crystalline polyester and the boron nitride.

2 Claims, 1 Drawing Sheet

(56) References Cited

U.S. PATENT DOCUMENTS

| | | | |
|---|---|---|---|
| 2003/0038278 A1* | 2/2003 | Ishihara | 252/500 |
| 2004/0210032 A1 | 10/2004 | Okamoto et al. | |
| 2005/0256291 A1 | 11/2005 | Okamoto et al. | |
| 2006/0160987 A1 | 7/2006 | Ito et al. | |
| 2007/0026245 A1 | 2/2007 | Okamoto et al. | |
| 2007/0148467 A1* | 6/2007 | St. Lawrence et al. | 428/411.1 |
| 2008/0048150 A1 | 2/2008 | Hosoda et al. | |
| 2009/0229750 A1* | 9/2009 | Ito et al. | 156/322 |
| 2009/0315783 A1 | 12/2009 | Uehara et al. | |
| 2010/0226095 A1* | 9/2010 | Mimura et al. | 361/707 |
| 2012/0193131 A1 | 8/2012 | Kusakawa et al. | |
| 2012/0305182 A1 | 12/2012 | Azami et al. | |

FOREIGN PATENT DOCUMENTS

| | | | |
|---|---|---|---|
| JP | 02240138 A * | 9/1990 | |
| JP | 4-323889 A | 11/1992 | |
| JP | 5-167212 A | 7/1993 | |
| JP | 2002-146003 A | 5/2002 | |
| JP | 2002-220444 A | 8/2002 | |
| JP | 2005-325231 A | 11/2005 | |
| JP | 2006-88426 A | 4/2006 | |
| JP | 2006-193604 A | 7/2006 | |
| JP | 2006-225641 A | 8/2006 | |
| JP | 2007-106107 A | 4/2007 | |
| JP | 2007-261138 A | 10/2007 | |
| JP | 2008-75063 A | 4/2008 | |
| JP | 2008-169265 A | 7/2008 | |
| JP | 2009-024126 A | 2/2009 | |
| JP | 2009-167359 A | 7/2009 | |
| JP | 2010-31104 A | 2/2010 | |
| JP | 2010-31256 A | 2/2010 | |
| JP | 2010-098246 A | 4/2010 | |
| WO | 2008/042446 A2 | 4/2008 | |
| WO | WO 2009041300 A1 * | 4/2009 | |
| WO | 2011/037173 A1 | 3/2011 | |

OTHER PUBLICATIONS

Office Action issued Sep. 2, 2013 in Chinese Patent Application No. 201180014737.3 with English translation.
Liquid Crystalline Polymer—Synthesis Molding Applications-, Edited by Naoyuki Koide, CMC, published on Jun. 5, 1987, pp. 95-105.
International Search Report mailed Jun. 28, 2011 in International Application No. PCT/JP2011/061167.
International Preliminary Report on Patentability and Written Opinion issued Dec. 13, 2012 in International Application No. PCT/JP2011/061167 with translation.
Final Office Action issued Oct. 1, 2013 in Japanese Patent Application No. 2010-121940 with English translation.
Second Office Action issued Jan. 21, 2014 in Chinese Patent Application No. 201180014737.3 with English translation.
Rejection Decision issued Apr. 30, 2014 in Chinese Patent Application No. 201180014737.3 with English translation.
Shiyuan Cheng et al., "The Manual for the production and application of adhesives", Chemical Industry Pressing, $1^{st}$ Edition, Apr. 2003, (3 pages total).
Communication dated Sep. 21, 2015 from the State Intellectual Property Office of the People's Republic of China in counterpart Application No. 201180014737.3.
Communication dated Mar. 3, 2016, from the State Intellectual Property Office of People's Republic of China in counterpart Application No. 201180014737.3.

* cited by examiner

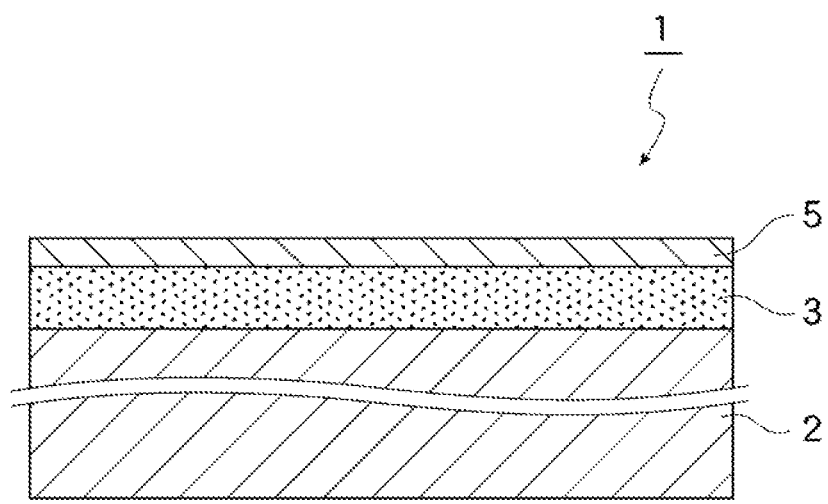

LIQUID COMPOSITION AND METAL-BASED CIRCUIT BOARD

TECHNICAL FIELD

The present invention relates to a liquid composition containing a liquid crystalline polyester, a solvent and a heat-conductive filler, and a metal base circuit substrate that uses this liquid composition.

Here, a "heat-conductive filler" means an inorganic or organic filler that has thermal conductivity properties.

Priority is claimed on Japanese Patent Application No. 2010-068780, filed Mar. 24, 2010, the content of which is incorporated herein by reference.

BACKGROUND ART

In recent years, in response to advancements in high-density packaging such as power transistors and hybrid ICs, metal base circuit substrates (such as metal-based wiring substrates and metal-based substrates) have been proposed that take due consideration of the heat generated from these heat-generating components. For example, as disclosed in Patent Documents 1 and 2, technology has been reported in which, in order to enhance heat dissipation from a metal base circuit substrate and stabilize operation of the mounted components, a heat-conductive filler (such as an inorganic powder or a spherical inorganic filler) is included within an insulating film (such as an adhesive layer) that is interposed between the metal substrate (also referred to as the "metal base") and the conductive foil used for forming the circuit (such as a thin metal or metal thin layer). In Patent Documents 1 and 2, an insulating film composed of a polymeric compound such as an epoxy resin is used as the insulating film, and alumina, aluminum nitride, boron nitride or some other compound is used as the heat-conductive filler.

On the other hand, it is known that liquid crystalline polyesters exhibit high thermal conductivity compared with epoxy resins and the like, and use of such liquid crystalline polyesters as the material for the insulating film that constitutes part of a metal base circuit substrate can be considered.

DOCUMENTS OF RELATED ART

Patent Documents

Patent Document 1: JP-04-323889-A (paragraphs [0004], [0006] and [0007])
Patent Document 2: JP-05-167212-A (paragraphs [0007] and [0008])

DISCLOSURE OF INVENTION

Problems to be Solved by the Invention

However, when a metal base circuit substrate is formed using an insulating film composed of a liquid crystalline polyester, if the insulating film is highly filled with a heat-conductive filler with the aim of further enhancing the thermal conductivity, then the insulating film suffers from an accompanying effective decrease in the contact surface area between the liquid crystalline polyester within the insulating film and the conductive foil, resulting in inferior adhesion. Because this conductive foil tends to be processed into a very fine shape during circuit pattern formation, it is necessary to ensure satisfactory adhesion so that the conductive foil does not detach from the insulating film even when this very fine pattern is formed.

In particular, in those cases where boron nitride is used as the heat-conductive filler, the inventors of the present invention have discovered that due to the longitudinal orientation of boron nitride, a high thermal conductivity that exceeds that predicted by the Bruggeman formula can be achieved. However, if an insulating film is highly filled with boron nitride, then as described above, the insulating film suffers from an accompanying effective decrease in the contact surface area between the liquid crystalline polyester within the insulating film and the conductive foil, resulting in inferior adhesion.

In light of these circumstances, a first object of the present invention is to provide a liquid composition that can be used favorably as the material for an insulating film that exhibits not only excellent thermal conductivity properties, but also excellent adhesion to a conductive foil, and a second object is to provide a metal base circuit substrate having superior heat dissipation properties that contains an insulating film formed from this type of liquid composition.

Means to Solve the Problems

In order to achieve these objects, the inventors of the present invention discovered that in an insulating film formed from a liquid composition prepared by adding boron nitride as a heat-conductive filler to a liquid crystalline polyester, the thermal conductivity and the adhesive strength of the insulating film depended significantly on the particle diameter of the boron nitride. Then, with the aim of increasing the thermal conductivity and the adhesive strength of the insulating film, the inventors focused their attention on the use of boron nitride having a large particle diameter as the heat-conductive filler, and were thus able to complete the present invention.

In other words, a first aspect of the present invention is a liquid composition containing a liquid crystalline polyester, a solvent, and a boron nitride having a volume average particle diameter of not less than 10 μm and not more than 80 μm, wherein the amount of the boron nitride is 30 to 90% by volume based on the total amount of the liquid crystalline polyester and the boron nitride.

Further, a second aspect of the present invention is the liquid composition of the first aspect, wherein the liquid crystalline polyester includes a first structural unit represented by the following formula (1), a second structural unit represented by the following formula (2), and a third structural unit represented by the following formula (3), and the amount of the first structural unit is 30 to 80 mol %, the amount of the second structural unit is 35 to 10 mol %, and the amount of the third structural unit is 35 to 10 mol %, based on the total amount of all the structural units:

—O—Ar¹—CO—   (1)

—CO—Ar²—CO— and   (2)

—X—Ar³—Y—   (3)

wherein Ar¹ represents a 1,4-phenylene group, 2,6-naphthalenediyl group or 4,4'-biphenylylene group; Ar² represents a 1,4-phenylene group, 1,3-phenylene group or 2,6-naphthalenediyl group; Ar³ represents a 1,4-phenylene group or 1,3-phenylene group; X represents —NH—; and Y represents —O— or —NH—.

Furthermore, a third aspect of the present invention is a liquid composition according to the first or second aspect, wherein the boron nitride is in the form of secondary aggregate particles.

Moreover, a fourth aspect of the present invention is a metal base circuit substrate having a metal substrate, an insulating film provided on the metal substrate, and a conductive foil for forming a circuit provided on the insulating film, wherein the insulating film is formed by removing a solvent from a casting material of the liquid composition according to any one of the first to third aspects.

Effects of the Invention

According to the present invention, even when a heat-conductive filler is highly filled within a liquid crystalline polyester, by using boron nitride having a large particle diameter as the heat-conductive filler, a liquid composition can be provided that can be used favorably as the material for an insulating film that exhibits excellent thermal conductivity properties and adhesion.

Further, by including an insulating film formed from this type of liquid composition, a metal base circuit substrate having superior heat dissipation properties can be provided.

BRIEF DESCRIPTION OF THE DRAWINGS

FIG. 1 is a cross-sectional view of a metal base circuit substrate according to an embodiment 1 of the present invention.

EMBODIMENTS OF THE INVENTION

Embodiments of the present invention are described below.

Embodiment 1 of the Present Invention

An embodiment 1 of the present invention is illustrated in FIG. 1. In this embodiment 1, a copper foil 5 is used as an example of the conductive foil.
<Structure of Metal Base Circuit Substrate>

As illustrated in FIG. 1, a metal base circuit substrate 1 according to this embodiment 1 has a metal substrate 2, and a insulating film 3 is laminated on the surface (the upper surface in FIG. 1) of the metal substrate 2. Moreover, a copper foil 5 is laminated on the surface (the upper surface in FIG. 1) of the insulating film 3.

The metal substrate 2 is composed of aluminum, copper, stainless steel, or an alloy of these metals, and the same substrates as those used in conventional metal base circuit substrates can be used. Further, the thickness of the metal substrate 2 is, for example, from 0.5 to 5 mm. The metal substrate 2 may have a flat shape, or may be bent into an arbitrary curbed shape.

Further, the insulating film 3 is composed of a liquid crystalline polyester containing a heat-conductive filler. This heat-conductive filler is described below.

Moreover, a circuit wiring pattern is formed, for example by etching or the like, in the copper foil 5. Using this wiring pattern, electronic components (not shown in the drawings) are mounted on top of the metal base circuit substrate 1. The thickness of the copper foil 5 is, for example, from 30 to 500 μm.
<Liquid Crystalline Polyester>

The liquid crystalline polyester that constitutes the insulating film 3 exhibits optical anisotropy when melted, and forms an anisotropic melt at a temperature of 450° C. or lower. In this embodiment 1, a solution obtained by dissolving the liquid crystalline polyester in a solvent (a liquid crystalline polyester solution) is used to form the insulating film 3.

This liquid crystalline polyester has a first structural unit represented by the following formula (1), a second structural unit represented by the following formula (2), and a third structural unit represented by the following formula (3), and the amount of the first structural unit is 30 to 80 mol %, the amount of the second structural unit is 35 to 10 mol %, and the amount of the third structural unit is 35 to 10 mol %, based on the total amount of all the structural units.

$$—O—Ar^1—CO— \quad (1)$$

$$—CO—Ar^2—CO— \text{ and} \quad (2)$$

$$—X—Ar^3—Y— \quad (3)$$

Here, $Ar^1$ represents a 1,4-phenylene group, 2,6-naphthalenediyl group or 4,4'-biphenylylene group. Further, $Ar^2$ represents a 1,4-phenylene group, 1,3-phenylene group or 2,6-naphthalenediyl group. Moreover, $Ar^3$ represents a 1,4-phenylene group or 1,3-phenylene group. Furthermore, X represents —NH—, and Y represents —O— or —NH—.

The first structural unit is a structural unit derived from an aromatic hydroxy acid, the second structural unit is a structural unit derived from an aromatic dicarboxylic acid, and the third structural unit is a structural unit that is derived from an aromatic diamine, an aromatic amine having a hydroxyl group, or an aromatic amino acid, but ester-forming derivatives may be used instead of these compounds.

Examples of ester-forming derivatives of carboxylic acids include derivatives in which the carboxyl group has been replaced with an acid chloride or a highly reactive group such as an acid anhydride group that promotes the reaction that generates a polyester, and derivatives which form an ester with an alcohol or ethylene glycol or the like, such as derivatives in which the carboxyl group generates a polyester via a transesterification.

Examples of ester-forming derivatives of a phenolic hydroxyl group include derivatives in which the phenolic hydroxyl group forms an ester with a carboxylic acid, such as a derivative that generates a polyester via a transesterification.

Examples of ester-forming derivatives of an amino group include derivatives in which the amino group forms an ester with a carboxylic acid, such as a derivative that generates a polyester via a transesterification.

Examples of the repeating structural units of the liquid crystalline polyester used in the present invention include those described below, but this is not an exhaustive list.

Examples of the first structural unit include structural units derived from p-hydroxybenzoic acid, 2-hydroxy-6-naphthoic acid and 4-hydroxy-4'-biphenylcarboxylic acid, and two or more types of structural units may be included within the total of all the structural units. Among these structural units, a liquid crystalline polyester structural unit that includes a structural unit derived from 2-hydroxy-6-naphthoic acid is preferred. The amount of the first structural unit is preferably 30 to 80 mol %, more preferably 40 to 70 mol %, and still more preferably 45 to 65 mol %, based on the total amount of all the structural units.

However, the amount (mol %) of this structural unit is selected appropriately from within a range that yields a total of 100 mol % for the combination of the first structural unit, the second structural unit and the third structural unit.

If the amount of the first structural unit exceeds 80 mol %, then the solubility tends to deteriorate markedly, whereas if the amount of the first structural unit is less than 30 mol %, the polyester tends to not exhibit liquid crystallinity.

Examples of the second structural unit include structural units derived from terephthalic acid, isophthalic acid or 2,6-naphthalenedicarboxylic acid, and two or more types of structural units may be included within the total of all the structural units. Among these structural units, from the viewpoint of solubility, a liquid crystalline polyester structural unit that includes a structural unit derived from isophthalic acid is preferred. The amount of the second structural unit is preferably 35 to 10 mol %, more preferably 30 to 15 mol %, and still more preferably 27.5 to 17.5 mol %, based on the total amount of all the structural units.

However, the amount (mol %) of this structural unit is selected appropriately from within a range that yields a total of 100 mol % for the combination of the first structural unit, the second structural unit and the third structural unit.

If the amount of the second structural unit exceeds 35 mol %, then the liquid crystallinity tends to deteriorate, whereas if the amount of the second structural unit is less than 10 mol %, the solubility tends to deteriorate.

Examples of the third structural unit include structural units derived from 3-aminophenol, 4-aminophenol, 1,4-phenylenediamine, 1,3-phenylenediamine and aminobenzoic acid, and two or more types of structural units may be included within the total of all the structural units. Among these structural units, from the viewpoint of reactivity, a liquid crystalline polyester structural unit that includes a structural unit derived from 4-aminophenol is preferred. The amount of the third structural unit is preferably 35 to 10 mol %, more preferably 30 to 15 mol %, and still more preferably 27.5 to 17.5 mol %, based on the total amount of all the structural units.

However, the amount (mol %) of this structural unit is selected appropriately from within a range that yields a total of 100 mol % for the combination of the first structural unit, the second structural unit and the third structural unit.

If the amount of the third structural unit exceeds 35 mol %, then the liquid crystallinity tends to deteriorate, whereas if the amount of the third structural unit is less than 10 mol %, the solubility tends to deteriorate.

The third structural unit is preferably used in an a mount that is essentially equal to that of the second structural unit. However, by varying the amount of the third structural unit within a range from −10 mol % to +10 mol % relative to the amount of the second structural unit, the polymerization degree of the liquid crystalline polyester can be controlled.

The combined total of all the structural units preferably consists of essentially only the first structural unit, the second structural unit and the third structural unit.

There are no particular limitations on the method of producing the liquid crystalline polyester used in the present invention. For example, a method may be used in which the phenolic hydroxyl group and the amino group of an aromatic hydroxy acid corresponding with the first structural unit, and an aromatic amine having a hydroxyl group or aromatic diamine group corresponding with the third structural unit are acylated using an excess of a fatty acid anhydride to obtain an acylated product, and the thus obtained acylated product and an aromatic dicarboxylic acid corresponding with the second structural unit are subjected to a melt polymerization by transesterification (polycondensation). The acylated product may employ a fatty acid ester obtained by performing an acylation in advance (for example, see JP-2002-220444-A and JP-2002-146003-A).

In the above acylation reaction, the amount used of the fatty acid anhydride is preferably from 1 to 1.2 equivalents, and more preferably from 1.05 to 1.1 equivalents, relative to the total amount of phenolic hydroxyl groups and amino groups. If the amount used of the fatty acid anhydride is less than 1 equivalent, then the acylated product and the raw material monomers and the like tend to undergo sublimation during the transesterification (polycondensation), increasing the likelihood of blockages of the reaction system. In contrast, if the amount used of the fatty acid anhydride exceeds 1.2 equivalents, then coloration of the obtained liquid crystalline polyester tends to become marked.

The acylation reaction is preferably performed at 130 to 180° C. for 5 minutes to 10 hours, and is more preferably performed at 140 to 160° C. for 10 minutes to 3 hours.

There are no particular limitations on the fatty acid anhydride used in the acylation reaction, and examples include acetic anhydride, propionic anhydride, butyric anhydride, isobutyric anhydride, valeric anhydride, pivalic anhydride, 2-ethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride and β-bromopropionic anhydride, and two or more of these acid anhydrides may be used within a mixture. From the viewpoints of cost and handling, acetic anhydride, propionic anhydride, butyric anhydride and isobutyric anhydride are preferred, and acetic anhydride is particularly preferred.

In the above transesterification, the amount of acyl groups within the acylated product is preferably 0.8 to 1.2 equivalents based on the amount of carboxyl groups.

The transesterification is preferably performed while increasing the temperature within a range from 130 to 400° C. at a rate of 0.1 to 50° C./minute, and is more preferably performed while increasing the temperature within a range from 150 to 350° C. at a rate of 0.3 to 5° C./minute.

When performing the transesterification of the fatty acid ester obtained via the above acylation and the carboxylic acid, in order to move the equilibrium in accordance with the Le Chatelier-Brown principle (equilibrium movement principle), the by-product fatty acid and unreacted fatty acid anhydride are preferably removed from the system by evaporation or the like.

The above acylation reaction and the above transesterification may be performed in the presence of a catalyst. Conventional catalysts that are known as catalysts for polyester polymerization can be used as this catalyst, and examples include metal salt catalysts such as magnesium acetate, stannous acetate, tetrabutyl titanate, lead acetate, sodium acetate, potassium acetate and antimony trioxide; and organic compound catalysts such as N,N-dimethylaminopyridine and N-methylimidazole.

Among these catalysts, a heterocyclic compound containing two or more nitrogen atoms such as N,N-dimethylaminopyridine or N-methylimidazole can be used particularly favorably (see JP-2002-146003-A).

This catalyst is usually added when the monomers are added, and need not necessarily be removed following the acylation, In those cases where the catalyst is not removed, the transesterification can be performed immediately.

Polycondensation via the above transesterification is usually performed by melt polymerization, but a combination of melt polymerization and solid phase polymerization may also be used. The solid phase polymerization is preferably performed by extracting the polymer from the melt polymerization step, subsequently grinding the polymer to produce a powder or flake form, and then using a conventional solid phase polymerization method. Specifically, the solid phase polymerization can be conducted, for example, by performing a heat treatment operation in a solid phase state for 1 to 30 hours, at a temperature of 20 to 350° C., and under an atmosphere of an inert gas such as nitrogen. This solid phase polymerization may be performed while the solid is stirred, or may be performed in a still state without stirring. By fitting an appropriate stirring mechanism, the melt polymerization tank and the solid phase polymerization tank can employ the same reaction tank. Further, following this type of solid phase polymerization, the obtained liquid crystalline polyester may be pelletized using a conventional method.

Production of the liquid crystalline polyester can be performed, for example, using a batch apparatus or a continuous apparatus or the like.

<Solvent>

The liquid crystalline polyester obtained in this manner is dissolved in a prescribed solvent to prepare a liquid crystalline polyester solution.

This solvent is preferably an aprotic solvent. The solvent is preferably a solvent that dissolves the liquid crystalline polyester, but a solvent that does not dissolve (but rather disperses) the liquid crystalline polyester may also be used. There are no particular limitations on the amount used of the solvent, which may be selected appropriately in accordance with the intended application, but the use of 0.01 to 100 parts by mass of the liquid crystalline polyester per 100 parts by mass of the solvent is preferred. If the amount of the liquid crystalline polyester is less than 0.01 parts by mass, then the solution viscosity tends to be too low, and a uniform coating cannot be achieved, whereas if the amount of the liquid crystalline polyester exceeds 100 parts by mass, then the viscosity tends to increase. From the viewpoints of workability and economic viability, the amount of the liquid crystalline polyester is preferably 1 to 50 parts by mass, and more preferably 2 to 40 parts by mass, per 100 parts by mass of the solvent.

Examples of the above aprotic solvent include halogenated solvents such as 1-chlorobutane, chlorobenzene, 1,1-dichloroethane, 1,2-dichloroethane, chloroform and 1,1,2,2-tetrachloroethane; ether-based solvents such as diethyl ether, tetrahydrofuran and 1,4-dioxane; ketone-based solvents such as acetone and cyclohexanone; ester-based solvents such as ethyl acetate; lactone-based solvents such as γ-butyrolactone; carbonate-based solvents such as ethylene carbonate and propylene carbonate; amine-based solvents such as triethylamine and pyridine; nitrile-based solvents such as acetonitrile and succinonitrile; amide-based solvents such as N,N'-dimethylformamide, N,N'-dimethylacetamide, tetramethylurea and N-methylpyrrolidone; nitro-based solvents such as nitromethane and nitrobenzene; sulfide-based solvents such as dimethylsulfoxide and sulfolane; and phosphoric acid-based solvents such as hexamethylphosphoramide and tri-n-butylphosphoric acid.

Among these solvents, the use of a solvent that does not contain halogen atoms is preferable from the perspective of environmental impact, and the use of a solvent for which the dipolar moment is not less than 3 and not more than 5 is preferable from the viewpoint of solubility. Specifically, amide-based solvents such as N,N'-dimethylformamide, N,N'-dimethylacetamide, tetramethylurea and N-methylpyrrolidone; and lactone-based solvents such as γ-butyrolactone can be used particularly favorably, and N,N'-dimethylformamide, N,N'-dimethylacetamide and N-methylpyrrolidone are even more desirable.

<Heat-Conductive Filler>

A prescribed heat-conductive filler is added to the thus obtained liquid crystalline polyester solution to obtain a liquid composition.

Boron nitride having a large particle diameter, and specifically boron nitride having a volume average particle diameter of at least 10 μm, and preferably 15 μm or greater, is used as this heat-conductive filler. The amount of this boron nitride is 30 to 90% by volume, and preferably 50 to 80% by volume, based on the total amount of the liquid crystalline polyester and the boron nitride. This boron nitride is preferably in the form of secondary aggregate particles.

The volume average particle diameter of the above boron nitride varies depending on the thickness of the insulating film 3, but from the viewpoint of increasing the withstand voltage of the insulating film 3, is preferably not more than 80 μm, and more preferably 30 μm or less.

In other words, the volume average particle diameter of the boron nitride is preferably at least 10 μm and not more than 80 μm, and more preferably at least 15 μm and not more than 30 μm.

The volume average particle diameter of the boron nitride can be determined by performing a particle diameter distribution measurement using a laser diffraction and scattering method, and measuring the D50 value. The volume average particle diameter of the boron nitride can be controlled as desired by classifying a boron nitride having a large particle diameter distribution.

<Other Components>

In addition to the heat-conductive filler described above, other conventional fillers or additives or the like may be added to the liquid composition in amounts that do not impair the objects of the present invention.

Examples of the above fillers include organic fillers such as epoxy resin powders, melamine resin powders, urea resin powders, benzoguanamine resin powders and styrene resins and the like; and inorganic fillers such as silica, alumina, titanium oxide, zirconia, kaolin, calcium carbonate and calcium phosphate.

Examples of the above additives include various coupling agents, anti-settling agents, ultraviolet absorbers and thermal stabilizers.

Furthermore, this liquid composition may also include one or more materials selected from among polypropylenes, polyamides, polyesters, polyphenylene sulfides, polyetherketones, polycarbonates, polyethersulfones, polyphenyl ethers and modified products thereof; thermoplastic resins such as polyetherimides; and elastomers such as copolymers of glycidyl methacrylate and polyethylene, provided the objects of the present invention are not impaired.

<Insulating Film>

The liquid composition obtained in this manner is, where necessary, filtered using a filter or the like to remove fine foreign particles contained within the liquid composition, and the liquid composition is then flow-cast uniformly and with good surface flatness onto the substrate. Subsequently, the solvent is removed from the liquid composition to generate a film, thus forming the insulating film 3 of the present invention.

Here, the flow casting method used for the liquid composition may employ any of various methods, including roller coating methods, dip coating methods, spray coating methods, spin coating methods, curtain coating methods, slot coating methods and screen printing methods.

Further, although there are no particular limitations on the method used for removing the solvent, removal by evaporation of the solvent is preferred. Examples of methods of evaporating the solvent include methods that employ heating, reduced pressure or air blowing.

Among these possibilities, in terms of production efficiency and handling properties, evaporating the solvent by heating is preferred, and evaporating the solvent by heating while blowing air onto the composition is more preferred. The heating conditions at this time preferably include a step of performing preliminary drying by heating at 60 to 200° C. for 10 minutes to 2 hours, and a step of performing a heat treatment at 200 to 400° C. for 30 minutes to 5 hours.

From the viewpoints of film formability and the mechanical properties, the thickness of the insulating film 3 is typically 0.5 to 500 μm, from the viewpoint of increasing the withstand voltage of the insulating film 3, the thickness is preferably at least 1.25 times the volume average particle diameter of the boron nitride (in other words, the volume average particle diameter of the boron nitride is preferably not more than 80% of the thickness of the insulating film 3), and from the viewpoint of suppressing the thermal resistance to a low level, the thickness is preferably not more than 200 μm.

By sequentially laminating this insulating film 3 and the copper foil 5 onto the surface of the metal substrate 2, a metal base circuit substrate 1 having a three-layer structure composed of the metal substrate 2, the insulating film 3 and the copper foil 5 is obtained.

In the metal base circuit substrate 1 obtained in this manner, because, as described above, a boron nitride having a large particle diameter is incorporated as a heat-conductive filler within the insulating film 3, the thermal conductivity properties and the adhesion of the insulating film 3 are superior to those observed when a boron nitride having a small particle diameter is incorporated within the insulating film.

It is thought that the reason for this observation is that the state of the orientation of the plurality of boron nitride particles within the insulating film 3 varies naturally in accordance with the volume average particle diameter of the boron nitride.

First, the fact that the thermal conductivity properties of the insulating film 3 improve with a boron nitride having a large particle diameter is thought to be due to the following reason. Namely, boron nitride has a squamous chemical structure (of the primary particles) with a hexagonal crystal system, and comparing the direction in which the hexagonal planes overlap (hereafter referred to as the "main axis direction") and the direction orthogonal thereto (hereafter referred to as the "main axis orthogonal direction"), the thermal conductivity in the former direction is an order of magnitude smaller than that in the latter direction. When the volume average particle diameter of the boron nitride is less than a predetermined value (approximately 10 μm), the boron nitride, in the form of these types of primary particles, is oriented between the metal substrate 2 and the copper foil 5 with the main axis direction (namely, the direction in which the thermal conductivity is small) coinciding with the direction of lamination on the metal base circuit substrate 1 (the vertical direction in FIG. 1), and therefore the thermal conductivity is inevitably reduced. In contrast, when the volume average particle diameter of the boron nitride is at least as large as a predetermined value (approximately 10 μm), pluralities of primary particles aggregate in substantially spherical shapes to form secondary aggregate particles. Within these secondary aggregate particles, because each primary particle is oriented in a random direction, the thermal conductivity increases by an amount equivalent to the increase in primary particles for which the main axis orthogonal direction (namely, the direction in which the thermal conductivity is large) is close to the lamination direction of the metal base circuit substrate 1.

Further, the fact that the adhesion of the insulating film 3 improves with a boron nitride having a large particle diameter is thought to be due to the following reason. Namely, boron nitride has a squamous chemical structure (of the primary particles) with a hexagonal crystal system, and there is a difference in chemical bonding strength, caused by the existence or absence of polar functional groups, between the plane orthogonal to the main axis direction and the other planes. When the volume average particle diameter of the boron nitride is less than a predetermined value (approximately 10 μm), the boron nitride, in the form of these types of primary particles, is oriented between the metal substrate 2 and the copper foil 5 with the main axis direction (namely, the direction in which bonding strength is weak) coinciding with the direction of lamination on the metal base circuit substrate 1 (the vertical direction in FIG. 1), and therefore the adhesive strength inevitably weakens. In contrast, when the volume average particle diameter of the boron nitride is at least as large as a predetermined value (approximately 10 μm), pluralities of primary particles aggregate in substantially spherical shapes to form secondary aggregate particles. Within these secondary aggregate particles, because each primary particle is oriented in a random direction, the adhesive strength increases by an amount equivalent to the increase in primary particles for which the main axis orthogonal direction (namely, the direction in which the bonding strength is large) is close to the lamination direction of the metal base circuit substrate 1.

Moreover, the fact that the adhesion of the insulating film 3 improves with a boron nitride having a large particle diameter is also thought to be due to the following reason. Namely, the adhesive strength of the insulating film 3 varies depending on the size of the contact surface area between the liquid crystalline polyester within the insulating film 3 and the copper foil roughened surface. When the volume average particle diameter of the boron nitride is smaller than the spacing between protrusions (approximately 10 to 15 μm) on the copper foil roughened surface, the boron nitride particles are prone to entering the spaces between the protrusions on the copper foil roughened surface during lamination, resulting in a reduction in the contact surface area between the liquid crystalline polyester and the copper foil, and a consequent decrease in the adhesive strength. In contrast, when the volume average particle diameter of the boron nitride is larger than the spacing between protrusions on the copper foil roughened surface, the boron nitride particles are unlikely to enter the spaces between the protrusions on the copper foil roughened surface during lamination, and therefore the contact surface area between the liquid crystalline polyester and the copper foil increases, and the adhesive strength improves. Accordingly, the larger the volume average particle diameter of the boron nitride, the smaller the amount of particles that are smaller than the spacing between protrusions on the copper foil roughened surface, and therefore the better the adhesive strength.

The liquid composition of the present invention exhibits minimal corrosiveness and is easy to handle, and the insulating film 3 obtained using the liquid composition has minimal anisotropy in the longitudinal direction (the flow-casting direction) and the transverse direction (the direction perpendicular to the flow-casting direction), exhibits excellent mechanical strength, and also exhibits excellent performance such as high cycle characteristics and low water absorption which are inherent to the liquid crystalline polyester. Accordingly, the insulating film 3 can be used not only for the metal base circuit substrate 1, but also for the insulating film for other electronic components.

The term "film" used in the description of the present invention includes sheet-like films from very thin films through to thick films, but is not limited solely to sheet-like members, and also includes bottle-shaped containers and the like.

Other Embodiments of the Present Invention

In the embodiment 1 described above, a description was provided of a metal base circuit substrate 1 having a three-layer structure in which only one set of the insulating film 3 and the copper foil 5 was laminated on the surface (the upper surface in FIG. 1) of the metal substrate 2. However, the present invention can also be applied in a similar manner to a metal base circuit substrate 1 having a 5-layer structure or 7-layer structure or the like, in which a plurality of sets (two or more) of the insulating film 3 and the copper foil 5 are laminated.

Furthermore, in the embodiment 1 described above, a description was provided of a metal base circuit substrate 1 in which the copper foil 5 was provided on the surface (the upper surface in FIG. 1) of the metal substrate 2 with the insulating film 3 disposed therebetween. However, the present invention can also be applied in a similar manner to a metal base circuit substrate 1 in which copper foils 5 are provided on both surfaces (the upper and lower surfaces in FIG. 1) of the metal substrate 2, with an insulating film 3 provided between the substrate and each copper foil.

Moreover, in the embodiment 1 described above, a description was provided of the case where the copper foil 5 was used as the conductive foil. However, provided the foil exhibits conductivity, a metal foil other than the copper foil 5 (such as a gold foil, silver foil, aluminum foil or stainless steel foil) or a carbon graphite sheet or the like can be used as the conductive foil, either instead of the copper foil, or in combination with the copper foil, and furthermore, a foil prepared by gold plating or silver plating a copper foil can also be used as the conductive foil, either instead of the copper foil, or in combination with the copper foil.

EXAMPLES

Examples of the present invention are described below. However, the present invention is in no way limited by the examples.

(a) Production of Liquid Crystalline Polyester

First, a reactor equipped with a stirrer, a torque meter, a nitrogen gas inlet tube, a thermometer and a reflux condenser was charged with 1,976 g (10.5 mols) of 2-hydroxy-6-naphthoic acid, 1,474 g (9.75 mols) of 4-hydroxyacetanilide, 1,620 g (9.75 mols) of isophthalic acid and 2,374 g (23.25 mols) of acetic anhydride. Following thorough flushing of the inside of the reactor with nitrogen gas, the temperature was increased to 150° C. over a period of 15 minutes under a stream of nitrogen gas, and this temperature (150° C.) was then held while the contents were refluxed for 3 hours.

Subsequently, the temperature of the contents was increased to 300° C. over a period of 170 minutes, while the by-product acetic acid and unreacted acetic anhydride were removed by distillation. The point where an increase in torque was noticed was deemed to indicate the reaction endpoint, and the contents were extracted from the reactor. The extracted contents were cooled to room temperature and then ground in a grinder, yielding a liquid crystalline polyester powder having a comparatively low molecular weight. Measurement of the flow initiation temperature of the thus obtained liquid crystalline polyester powder using a flow tester [model: CFT-500] manufactured by Shimadzu Corporation revealed a result of 235° C. This liquid crystalline polyester powder was subjected to a solid phase polymerization by performing a heat treatment in a nitrogen atmosphere at 223° C. for 3 hours. The flow initiation temperature of the liquid crystalline polyester following the solid phase polymerization was 270° C.

(b) Preparation of Liquid Crystalline Polyester Solution

Next, 2,200 g of the liquid crystalline polyester obtained in (a) above was added to 7,800 g of N,N-dimethylacetamide (DMAc), and the mixture was heated at 100° C. for 2 hours to obtain a liquid crystalline polyester solution. The viscosity of the solution at this point was 320 cP. This solution viscosity represents the value measured at room temperature (23° C.) using a B-type viscometer [model: TVL-20] (rotor No. 21, rotation rate: 5 rpm) manufactured by Toki Sangyo Co., Ltd.

(c) Preparation of Metal Base Circuit Substrate

Example 1

A squamous aggregate boron nitride powder having a volume average particle diameter (D50: the measured value obtained using a laser diffraction-type particle diameter distribution analyzer [MasterSizer 2000] manufactured by Malvern Instruments Ltd.) of 27.2 μm (a boron nitride powder [HP40 MF100] manufactured by Mizushima Ferroalloy Co., Ltd.) was added as a heat-conductive filler to the liquid crystalline polyester solution obtained in (b) above (solid fraction: 22% by mass), thus obtaining a liquid composition. Here, the filling amount of the boron nitride powder (heat-conductive filler) was 65% by volume based on the total amount of the liquid crystalline polyester and the boron nitride powder.

Next, the thus obtained liquid composition was stirred for 5 minutes in a centrifugal deaerator, and was then applied to a copper foil (conductive foil) of thickness 70 μm in an amount sufficient to form a thickness of 350 μm. Subsequently, the applied composition was dried at 40° C. for one hour, and was then subjected to a heat treatment at 300° C. for 3 hours. As a result, a liquid crystalline polyester film of thickness 100 μm having a copper foil formed on the surface was obtained.

Subsequently, the above liquid crystalline polyester film was laminated to an aluminum alloy sheet (metal substrate) having a thermal conductivity of 140 W/(m·K) and a thickness of 2 mm. At this time, the back surface of the liquid crystalline polyester film (the surface on which the copper foil was not formed) was brought into contact with the surface of the aluminum alloy sheet. Then, by performing a heat treatment for 20 minutes at a pressure of 19.6 MPa (200 kgf/cm$^2$) and a temperature of 340° C., the aluminum alloy sheet and the liquid crystalline polyester film were thermobonded together, completing preparation of a metal base circuit substrate.

Example 2

With the exception of replacing the aforementioned boron nitride powder [HP40 MF100], and using a squamous aggregate boron nitride powder having a volume average particle diameter (D50) of 67.9 μm (obtained by using screening to classify the boron nitride powder [HP40 MF100] manufactured by Mizushima Ferroalloy Co., Ltd.) as the heat-conductive filler, a metal base circuit substrate was prepared using the same procedure as example 1.

Example 3

With the exception of replacing the aforementioned boron nitride powder [HP40 MF100], and using a squamous aggregate boron nitride powder having a volume average particle diameter (D50) of 14.7 μm (obtained by using screening to classify the boron nitride powder [HP40 MF100] manufactured by Mizushima Ferroalloy Co., Ltd.) as the heat-conductive filler, a metal base circuit substrate was prepared using the same procedure as example 1.

Comparative Example 1

With the exception of replacing the aforementioned boron nitride powder [HP40 MF100], and using a squamous boron nitride powder having a volume average particle diameter (D50) of 5.9 μm (a boron nitride powder [HP40 J5] manufactured by Mizushima Ferroalloy Co., Ltd.) as the heat-conductive filler, a metal base circuit substrate was prepared using the same procedure as example 1.

Comparative Example 2

With the exception of replacing the aforementioned boron nitride powder [HP40 MF100], and using a squamous aggregate boron nitride powder having a volume average particle diameter (D50) of 9.0 μm (a boron nitride powder [HP40P] manufactured by Mizushima Ferroalloy Co., Ltd.) as the heat-conductive filler, a metal base circuit substrate was prepared using the same procedure as example 1.

<Evaluation of Thermal Conductivity Properties>

In order to evaluate the thermal conductivity properties of the insulating film in each of the metal base circuit substrates of these examples 1 to 3 and comparative examples 1 and 2, the thermal conductivity (units: W/(m·K)) of the insulating film was calculated using the following formula.

(Thermal conductivity)=(thermal diffusivity)×(specific heat)×(density)

Here, the thermal diffusivity was measured by cutting a sample having dimensions of length 10 mm×breadth 10 mm×thickness 0.1 mm from the metal base circuit substrate, and then measuring the thermal diffusivity at room temperature by the temperature wave thermal analysis method using a measurement system [ai-Phase Mobile] manufactured by ai-Phase Co., Ltd.

Further, the specific heat was measured using a differential scanning calorimeter (DSC), by comparison with a sapphire standard reference material.

Moreover, the density was measured using the Archimedes method.

The results are collated in Table 1.

<Evaluation of Adhesion>

In order to evaluate the adhesion between the insulating film and the copper foil in each of the metal base circuit substrates of these examples 1 to 3 and comparative examples 1 and 2, a T-peel strength test was performed.

In other words, in each of these metal base circuit substrates, the copper foil was etched to form a conductive pattern having a width of 10 mm. Then, the strength required to pull the copper foil vertically at a rate of 50 mm/minute, namely the T-peel strength (units: N/cm), was measured.

The results are collated in Table 1.

TABLE 1

| | Example 1 | Example 2 | Example 3 | Comparative example 1 | Comparative example 2 |
|---|---|---|---|---|---|
| Volume average particle diameter [μm] | 27.2 | 67.9 | 14.7 | 5.9 | 9 |
| Thermal conductivity [W/(m · K)] | 8.8 | 14 | 8.5 | 5.7 | 6.4 |
| T-peel strength [N/cm] | 7.3 | 9.1 | 6.4 | 4.1 | 4.5 |

As is evident from Table 1, it was demonstrated that as the volume average particle diameter was increased, the thermal conductivity of the insulating film increased, and the T-peel strength (adhesive strength) increased.

INDUSTRIAL APPLICABILITY

The present invention can be applied widely, not only to power transistors and hybrid ICs, but also to metal base circuit substrates for mounting other electronic components such as light emitting diodes, and is therefore extremely useful industrially.

DESCRIPTION OF THE REFERENCE SIGNS

1: Metal base circuit substrate
2: Metal substrate
3: Insulating film
5: Copper foil (conductive foil)

The invention claimed is:

1. A metal base circuit substrate comprising a metal substrate, an insulating film provided on the metal substrate, and a conductive foil for forming a circuit provided on the insulating film, wherein
the thickness of the metal substrate is from 0.5 to 5 mm,
the insulating film is formed by removing a solvent from a casting material of a liquid composition,
the liquid composition comprises a liquid crystalline polyester, the solvent, and a boron nitride having a volume average particle diameter of not less than 10 μm and not more than 30 μm,
an amount of the boron nitride is 30 to 90% by volume, based on a total amount of the liquid crystalline polyester and the boron nitride, and
the boron nitride is in the form of secondary aggregate particles.

2. The metal base circuit substrate according to claim 1, wherein
the liquid crystalline polyester comprises a first structural unit represented by a following formula (1), a second structural unit represented by a following formula (2), and a third structural unit represented by a following formula (3), and
an amount of the first structural unit is 30 to 80 mol %, an amount of the second structural unit is 10 to 35 mol %, and an amount of the third structural unit is 10 to 35 mol %, based on a total amount of all structural units:

   (1)

   (2)

—X—Ar³—Y— (3)

wherein Ar¹ represents a 1,4-phenylene group, 2,6-naphthalenediyl group or 4,4'-biphenylylene group; Ar² represents a 1,4-phenylene group, 1,3-phenylene group or 2,6-naphthalenediyl group; Ar³ represents a 1,4-phenylene group or 1,3-phenylene group; X represents —NH—; and Y represents —O— or —NH—.

* * * * *